(12) United States Patent
Tominaga et al.

(10) Patent No.: US 12,048,102 B2
(45) Date of Patent: Jul. 23, 2024

(54) ELECTRONIC CIRCUIT PRODUCTION METHOD USING 3D LAYER SHAPING

(71) Applicant: FUJI CORPORATION, Chiryu (JP)

(72) Inventors: Ryojiro Tominaga, Okazaki (JP); Kenji Tsukada, Toyota (JP); Ryo Sakakibara, Anjo (JP); Tasuku Takeuchi, Kariya (JP)

(73) Assignee: FUJI CORPORATION, Chiryu (JP)

(*) Notice: Subject to any disclaimer, the term of this patent is extended or adjusted under 35 U.S.C. 154(b) by 51 days.

(21) Appl. No.: 17/630,860

(22) PCT Filed: Jul. 30, 2019

(86) PCT No.: PCT/JP2019/029791
§ 371 (c)(1),
(2) Date: Jan. 27, 2022

(87) PCT Pub. No.: WO2021/019675
PCT Pub. Date: Feb. 4, 2021

(65) Prior Publication Data
US 2022/0279657 A1   Sep. 1, 2022

(51) Int. Cl.
*H05K 3/00* (2006.01)
*H05K 3/10* (2006.01)
*H05K 3/40* (2006.01)

(52) U.S. Cl.
CPC ............... *H05K 3/10* (2013.01); *H05K 3/40* (2013.01); *H05K 2203/0776* (2013.01)

(58) Field of Classification Search
CPC .................................. H05K 1/00; H05K 3/00
See application file for complete search history.

(56) References Cited

U.S. PATENT DOCUMENTS

| 2004/0000429 A1* | 1/2004 | Furusawa | ............ H05K 3/4647 |
| | | | 29/846 |
| 2011/0005822 A1 | 1/2011 | Momokawa | |

(Continued)

FOREIGN PATENT DOCUMENTS

| JP | H077249 A | * 6/1993 | ............... H05K 1/18 |
| JP | 2005-340279 A | 12/2005 | |

(Continued)

OTHER PUBLICATIONS

JPH077249A, english translation, (Year: 1993).*

(Continued)

*Primary Examiner* — Kelly M Gambetta
*Assistant Examiner* — Mohammad Mayy
(74) *Attorney, Agent, or Firm* — Oblon, McClelland, Maier & Neustadt, L.L.P.

(57) ABSTRACT

To provide an electronic circuit production method using 3D layer shaping capable of producing an electronic circuit having improved electrical properties and mechanical properties by utilizing characteristics of a fluid containing a metal particle by selectively using the fluid containing the metal particle. The electronic circuit production method using 3D layer shaping, the method including a wiring forming step of forming a wiring by applying a fluid containing a nano-sized metal nanoparticle on an insulating member and curing the applied fluid containing the metal nanoparticle; and a connection terminal forming step of forming a connection terminal electrically connected to the wiring by applying a fluid containing a micro-sized metal microparticle and curing the applied fluid containing the metal microparticle.

5 Claims, 8 Drawing Sheets

(56) References Cited

U.S. PATENT DOCUMENTS

| | | | | |
|---|---|---|---|---|
| 2011/0155432 A1* | 6/2011 | Tomonari | ............ | B22F 1/0545 |
| | | | | 174/257 |
| 2014/0000951 A1* | 1/2014 | Ryu | .................... | H05K 3/4007 |
| | | | | 205/125 |
| 2015/0279804 A1* | 10/2015 | Raravikar | ......... | B23K 35/3033 |
| | | | | 257/737 |
| 2015/0382463 A1* | 12/2015 | Kim | .................... | H05K 3/4007 |
| | | | | 29/829 |
| 2020/0346452 A1 | 11/2020 | Tominaga | | |

FOREIGN PATENT DOCUMENTS

| | | | |
|---|---|---|---|
| JP | 2017028053 A | * | 2/2017 |
| WO | WO 2018/142577 A1 | | 8/2018 |
| WO | WO 2019/102522 A1 | | 5/2019 |

OTHER PUBLICATIONS

JP-2017028053-A, English Translated (Year: 2017).*
International Search Report mailed on Oct. 8, 2019 in PCT/JP2019/029791 filed on Jul. 30, 2019, 2 pages.

* cited by examiner

CHARACTERISTICS OF CONDUCTIVE INK AND CONDUCTIVE PASTE

| | CONDUCTIVE INK | CONDUCTIVE PASTE |
|---|---|---|
| MAIN COMPONENT | METAL NANOPARTICLES + SOLVENT | METAL MICROPARTICLES (MICRO FILLER) + ADHESIVE |
| METAL PARTICLE DIAMETER | ~ SEVERAL HUNDRED NANOMETERS | ~ SEVERAL TENS OF MICROMETERS |
| METHOD OF CURING (FIRING) | HEATING | HEATING or IRRADIATION WITH ULTRAVIOLET RAYS |
| RESISTANCE OF WIRING | SEVERAL TO SEVERAL TENS OF MICRO Ωcm | SEVERAL TENS TO SEVERAL THOUSAND MICRO Ωcm |
| VISCOSITY | LOW VISCOSITY | MEDIUM ~ HIGH VISCOSITY |
| MAIN PRINTING WAY | INK JET | DISPENSER, SCREEN, GRAVURE |
| ADVANTAGE | LOW CIRCUIT WIRING RESISTANCE AVAILABILITY OF FINE INK JET PRINTING | GOOD ADHESION AND EXCELLENT ADHESION THICK FILMS TO BE CURED AND FORMED AT ONCE. |
| DISADVANATAGE | WEAK ADHESION WITH RESIN DIFFICULTY OF FORMING THICK FILM | DIFFICULTY OF FINE PRINTING HIGH CIRCUIT RESISTANCE |

ELECTRONIC CIRCUIT PRODUCTION METHOD USING 3D LAYER SHAPING

TECHNICAL FIELD

The present disclosure relates to a method of producing an electronic circuit using 3D layer shaping.

BACKGROUND ART

Conventionally, various techniques have been proposed for 3D layer shaping. For example, Patent Literature 1 discloses a technique of forming a laminate unit including an electronic component and an electronic circuit by 3D layer shaping. In a laminate unit forming device described in Patent Literature 1, an insulating layer is formed by discharging an ultraviolet curable resin onto a base material and curing the ultraviolet curable resin. In addition, the laminate unit forming device forms an electronic circuit to which a circuit wiring, a through-hole, and the like are connected using conductive ink or a metal paste.

PATENT LITERATURE

Patent Literature 1: International Publication No. WO2019/102522

BRIEF SUMMARY

Technical Problem

In a case where an electronic circuit is mounted on an insulating layer using a fluid containing metal by 3D layer shaping as in the technique according to the Patent Literature 1, the required electrical properties and mechanical properties of the electronic circuit to be shaped differ in accordance with the application and the like. On the other hand, the characteristics of the fluid containing the metal also differ in accordance with the type of fluid, and what part of the electronic circuit to be used is significantly important in determining the electrical properties and mechanical properties of the electronic circuit after shaping.

The present disclosure has been made in view of the above-described points, and it is an object thereof to provide an electronic circuit production method using 3D layer shaping capable of producing an electronic circuit having improved electrical properties and mechanical properties by utilizing characteristics of a fluid containing a metal particle by selectively using the fluid containing the metal particle.

Solution to Problem

According to an aspect of the present specification, there is disclosed an electronic circuit production method using 3D layer shaping, the method including a wiring forming step of forming a wiring by applying a fluid containing a nano-sized metal nanoparticle on an insulating member and curing the applied fluid containing the metal nanoparticle; and a connection terminal forming step of forming a connection terminal electrically connected to the wiring by applying a fluid containing a micro-sized metal microparticle and curing the applied fluid containing the metal microparticle.

Advantageous Effects

According to the present disclosure, the type of fluid containing metal particles is selectively used for the shaping of the connection terminal and the shaping of the wiring. In the case where the wiring is formed, the wiring is formed by applying and curing a fluid containing metal nanoparticles. As a result, the wiring having low resistance can be formed by curing nano-sized metal nanoparticles by contacting or fusing with each other. In addition, in a case where the connection terminal is formed, the connection terminal is formed by applying and curing the fluid containing metal microparticles. As a result, a layer having a certain thickness can be formed with micro-sized metal microparticles, and mechanical properties such as tensile strength of the connection terminal after shaping can be improved. Accordingly, it is possible to produce an electronic circuit having improved electrical properties and mechanical properties by utilizing the characteristics of the fluid containing the metal particles by selectively using the fluid containing the metal particles.

DESCRIPTION OF EMBODIMENTS

Hereinafter, preferred embodiments of the present disclosure will be described in detail with reference to the drawings.

(1) Configuration of Laminate Unit Forming Device

Figure 1:
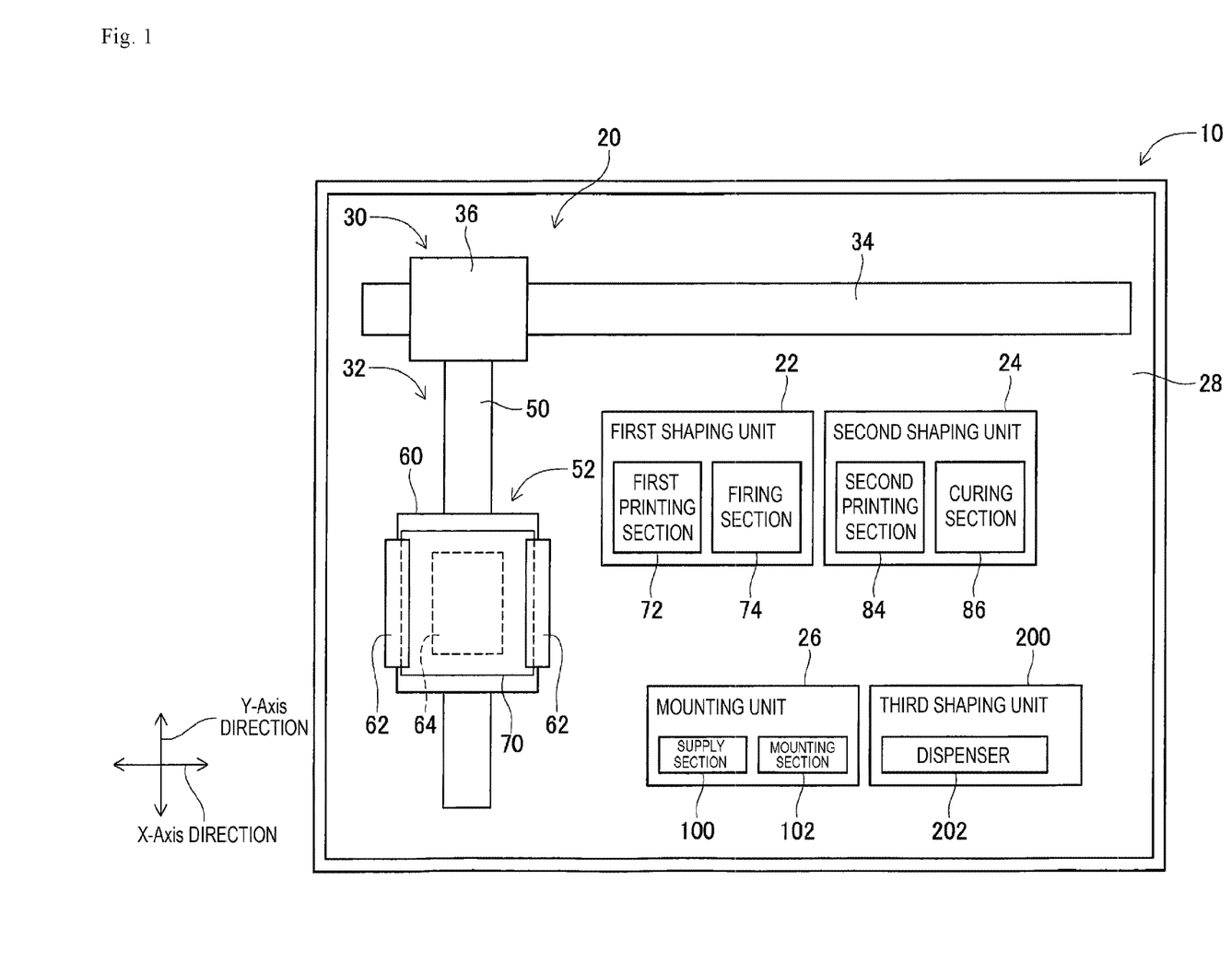
FIG. 1 is a diagram illustrating a laminate unit forming device.

FIG. 1 illustrates laminate unit forming device 10. Laminate unit forming device 10 is provided with conveyance device 20, first shaping unit 22, second shaping unit 24, mounting unit 26, third shaping unit 200, and control device 27 (refer to FIGS. 3 and 4). Conveyance device 20, first shaping unit 22, second shaping unit 24, mounting unit 26, and third shaping unit 200 are disposed on base 28 of laminate unit forming device 10. Base 28 has normally rectangular in a plan view. In the following description, a longitudinal direction of base 28 will be referred to as an X-axis direction, a shorter direction of base 28 will be referred to as a Y-axis direction, and a direction orthogonal to both of the X-axis direction and the Y-axis direction will be referred to as a Z-axis direction.

Conveyance device 20 is provided with X-axis slide mechanism 30 and Y-axis slide mechanism 32. X-axis slide mechanism 30 includes X-axis slide rail 34 and X-axis slider 36. X-axis slide rail 34 is disposed to extend in the X-axis direction on base 28. X-axis slider 36 is held by X-axis slide rail 34 to be slidable in the X-axis direction. Furthermore, X-axis slide mechanism 30 includes electromagnetic motor 38 (refer to FIG. 3) and moves X-axis slider 36 to any position in the X-axis direction by driving electromagnetic motor 38. In addition, Y-axis slide mechanism 32 includes Y-axis slide rail 50 and stage 52. Y-axis slide rail 50 is disposed to extend in the Y-axis direction on base 28. One end portion of Y-axis slide rail 50 is connected to X-axis slider 36. Therefore, Y-axis slide rail 50 is movable in the X-axis direction. Stage 52 is held by Y-axis slide rail 50 so as to be slidable in the Y-axis direction. Y-axis slide mechanism 32 includes electromagnetic motor 56 (refer to FIG. 2) and moves stage 52 to any position in the Y-axis direction by driving electromagnetic motor 56. As a result, by driving X-axis slide mechanism 30 and Y-axis slide mechanism 32, stage 52 is moved to any position on base 28.

Stage 52 includes base plate 60, holding device 62, and lifting and lowering device 64. Base plate 60 is formed in a flat plate shape, and base material 70 is placed on an upper surface thereof. Holding device 62 is provided on both side portions of base plate 60 in the X-axis direction. Holding device 62 fixedly holds base material 70 with respect to base plate 60 by interposing both edge portions in the X-axis direction of base material 70 placed on base plate 60. In addition, lifting and lowering device 64 is disposed below base plate 60, and lifts and lowers base plate 60 in the Z-axis direction.

Figure 2:
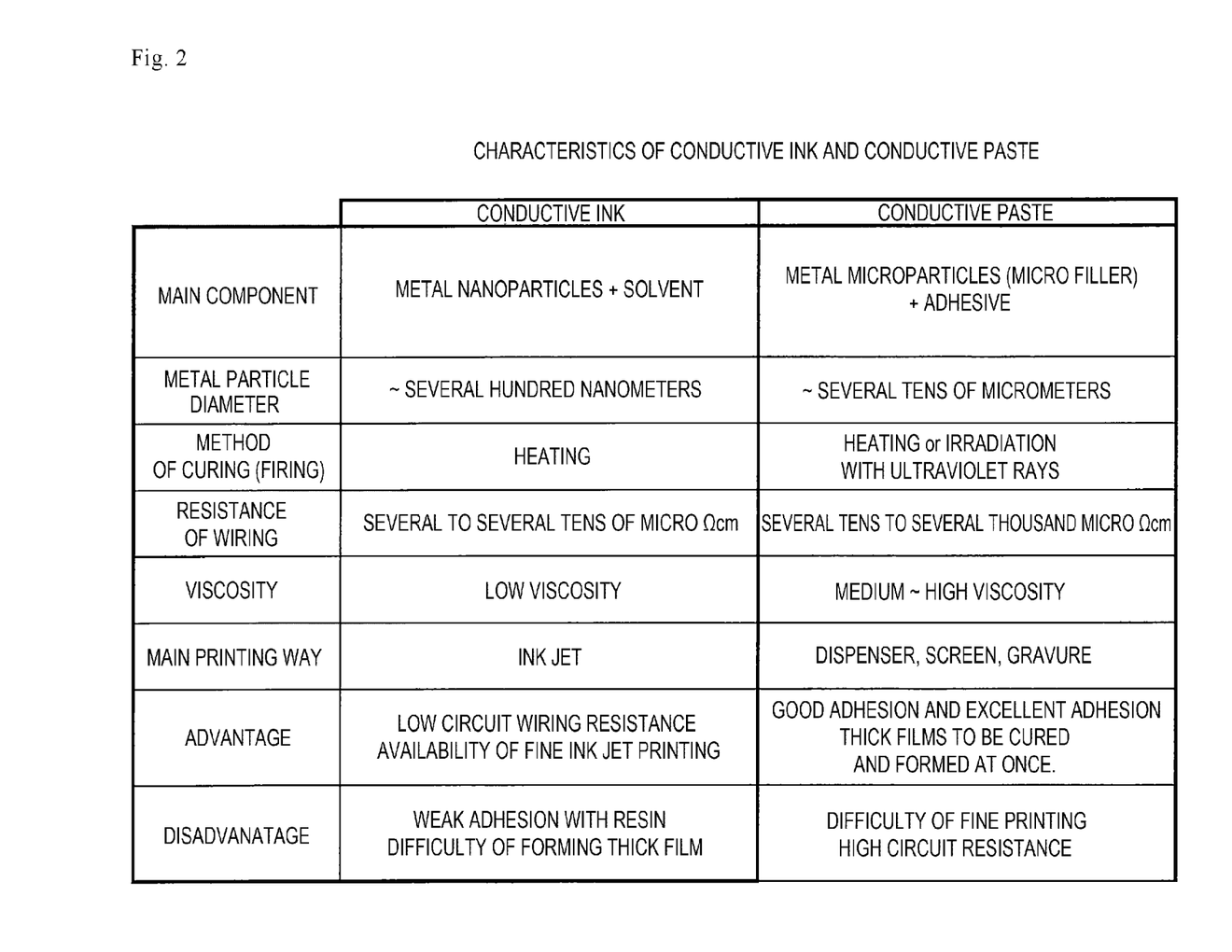
FIG. 2 is a table illustrating characteristics of conductive ink and a conductive paste.

First shaping unit 22 is a unit for shaping a circuit wiring on base material 70 placed on base plate 60 of stage 52, and includes first printing section 72 and firing section 74. First printing section 72 includes ink jet head 76 (refer to FIG. 3) and linearly discharges conductive ink on base material 70 placed on base plate 60. The conductive ink is an example of a fluid containing metal nanoparticles of the present disclosure. FIG. 2 is a table illustrating characteristics of conductive ink and a conductive paste described later. As illustrated in FIG. 2, the conductive ink includes, for example, fine particles of metal (such as silver) having a nanometer size as the main component dispersed in a solvent, and is cured by firing with heat. The conductive ink includes, for example, metal nanoparticles having a size of several hundred nanometers or less. The surface of the metal nanoparticle is coated with, for example, a dispersant to prevent aggregation in the solvent.

Ink jet head 76 discharges the conductive ink from multiple nozzles, for example, by a piezo method using a piezoelectric element. In addition, the device for discharging conductive ink (fluid containing metal nanoparticles) is not limited to an ink jet head including multiple nozzles, and may be, for example, a dispenser including one nozzle. In addition, the type of metal nanoparticles included in the conductive ink is not limited to silver, and may be copper, gold, or the like. In addition, the number of types of metal nanoparticles included in the conductive ink is not limited to one type, and may be multiple types.

Figure 3:
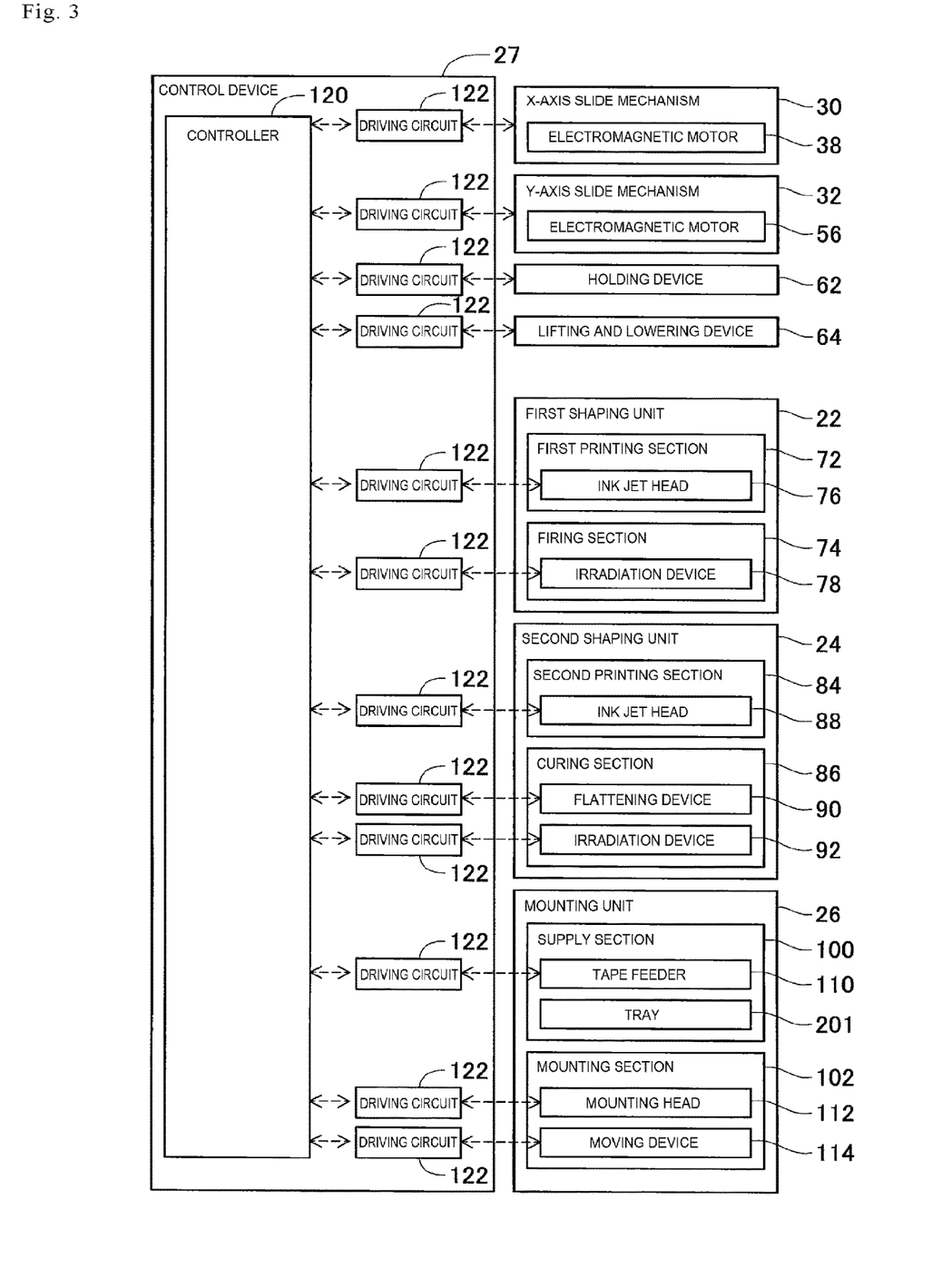
FIG. 3 is a block diagram illustrating a control device.

Firing section 74 includes irradiation device 78 (refer to FIG. 3). Irradiation device 78 is provided with, for example, an infrared heater that heats the conductive ink discharged on base material 70. The conductive ink is fired by applying heat from an infrared heater to form a circuit wiring. The firing of the conductive ink referred to herein means, for example, a phenomenon in which by applying energy, a solvent is vaporized or a protective film of the metal nanoparticles, that is, a dispersant is decomposed, and the metal nanoparticles are brought into contact with each other or fused to increase the conductivity. A circuit wiring can be formed by firing the conductive ink. The device for heating the conductive ink is not limited to an infrared heater. For example, laminate unit forming device 10 may be provided with an infrared lamp, a laser irradiation device that irradiates the conductive ink with laser light, or an electric furnace in which base material 70 from which the conductive ink is discharged is placed in a furnace and heated as a device for heating the conductive ink. In addition, the temperature at which the conductive ink is heated is not limited to, for example, a temperature of firing lower than the melting point of the metal included in the conductive ink, and may be a temperature higher than the melting point of the metal.

In addition, second shaping unit 24 is a unit for shaping an insulating layer (one example of the resin member of the present disclosure) on base material 70 placed on base plate 60, and includes second printing section 84 and curing section 86. Second printing section 84 includes ink jet head 88 (refer to FIG. 3), and discharges an ultraviolet curable resin on base material 70 placed on base plate 60. The ultraviolet curable resin is a resin that is cured by irradiation with ultraviolet rays. A method by which ink jet head 88 discharges the ultraviolet curable resin may be, for example, a piezo method using a piezoelectric element, or may be a thermal method in which the resin is heated to generate air bubbles and discharged from multiple nozzles.

Curing section 86 includes flattening device 90 (refer to FIG. 3) and irradiation device 92 (refer to FIG. 3). Flattening device 90 is a device for flattening an upper surface of the ultraviolet curable resin discharged onto base material 70 by ink jet head 88. Flattening device 90 makes the thickness of the ultraviolet curable resin uniform, for example, by scraping off excess resin by a roller or a blade while leveling the surface of the ultraviolet curable resin. In addition, irradiation device 92 is provided with a mercury lamp or LED as a light source, and irradiates the ultraviolet curable resin discharged onto base material 70 with ultraviolet rays. As a result, the ultraviolet curable resin discharged on base material 70 is cured, and an insulating layer can be formed.

In addition, mounting unit 26 is a unit for mounting an electronic component or a probe pin on base material 70 placed on base plate 60, and includes supply section 100 and mounting section 102. Supply section 100 includes multiple tape feeders 110 (refer to FIG. 3) for feeding the taped electronic components one by one, and supplies the electronic components at each supply position. Furthermore, supply section 100 includes tray 201 (refer to FIG. 3) in which probe pins are disposed in a standing state, and supplies the probe pins in a state capable of being picked up from tray 201. The electronic component is, for example, a sensor element such as a temperature sensor. In addition, the probe pin is a member that electrically connects the circuit wirings of one laminate unit and the circuit wirings of other laminate units. In addition, it is preferable to use a probe pin that can stroke in the axial direction by applying an external force. The supply of the electronic components is not limited to the supply by tape feeder 110, and may be performed by a tray. In addition, the supply of the probe pins is not limited to the supply by tray 201, and may be performed by a tape feeder. In addition, the supply of the electronic components and the probe pins may be performed by both the supply by the tape feeder and the supply by the tray, or may be performed by other supplies.

Mounting section 102 includes mounting head 112 (refer to FIG. 3) and moving device 114 (refer to FIG. 3). Mounting head 112 includes a suction nozzle for picking up and holding an electronic component or a probe pin. The suction nozzle picks up and holds the electronic component or the like by suction of air by supplying a negative pressure from a positive and negative pressure supply device (not illustrated). The electronic component or the like is separated by supplying a slight positive pressure from the positive and negative pressure supplying device. In addition, moving device 114 moves mounting head 112 between the supply position of tape feeder 110 or tray 201 and base material 70 placed on base plate 60. As a result, mounting section 102 holds the electronic component or the like by the suction nozzle, and disposes the electronic component or the like held by the suction nozzle on base material 70.

In addition, third shaping unit 200 is a unit for applying a conductive paste on base material 70 placed on base plate 60. The conductive paste is an example of a fluid containing the metal microparticles of the present disclosure. As illustrated in FIG. 2, the conductive paste is, for example, a viscous fluid in which micro-sized metal particles (for example, micro filler) are included in an adhesive made of a resin. The micro-sized metal microparticles are, for example, metal in a flake state (silver or the like). The metal microparticles are not limited to silver, and may be gold, copper, or the like, or multiple types of metals. The adhesive contains, for example, an epoxy resin as the main component. The conductive paste is cured by heating, and is used, for example, to form a connection terminal to be connected to the circuit wiring. As will be described later, the connection terminal is used for forming a connection terminal (bump) to be connected to a component terminal of an electronic component, an electrode pad (exposed pad or the like) to be connected to an external device or the like, a pin terminal provided at a contact location of a probe pin, a through-hole through which a circuit wiring is made conductive in the laminating direction, or the like.

In addition, third shaping unit 200 includes dispenser 202 as a device for discharging (applying) a conductive paste. As illustrated in FIG. 2, the device for applying the conductive paste is not limited to the dispenser, and may be a screen printing device or a gravure printing device. In addition, the term "applying" in the present disclosure is a concept including an operation of discharging a fluid from a nozzle or the like, and an operation of adhering a fluid on a target object by screen printing or gravure printing.

Dispenser 202 discharges the conductive paste into the through-hole of the insulating layer or on the surface or the like of the insulating layer. The conductive paste filled in the through-hole is heated and cured, for example, by firing section 74 of first shaping unit 22 to form the connection terminal or the through-hole. In addition, the conductive paste applied to the surface of the insulating layer is heated and cured by, for example, firing section 74 to form a connection terminal and the like.

As illustrated in FIG. 2, the conductive paste includes, for example, metal microparticles having a size of several tens of micrometers or less. The adhesive (resin or the like) is cured by heating, and the conductive paste is cured in a state where the metals in a flake state are in contact with each other. The method of curing the conductive paste is not limited to the method by heating, and may be a method of curing with ultraviolet rays using an ultraviolet curable resin as an adhesive.

As described above, the conductive ink is, for example, metal integrated by fusing the metal nanoparticles by heating, and the conductivity is increased as compared with a state where the metal nanoparticles are merely in contact with each other. On the other hand, the conductive paste is cured by bringing micro-sized metal microparticles into contact with each other, for example, by curing an adhesive. Therefore, the resistance (electrical resistivity) of the wiring formed by curing the conductive ink is significantly low, for example, several to several tens of micro $\Omega$·cm, and is lower than the resistance (several tens to several thousands of micro $\Omega$·cm) of the wiring in which the conductive paste is cured. Accordingly, the conductive ink is suitable for shaping a shaped object requiring a low resistance value, such as a circuit wiring having a low resistance.

On the other hand, the conductive paste can improve the adhesion with other members by curing the adhesive when curing, and is excellent in the adhesion with other member as compared with the conductive ink. The other member referred to herein is a member to which a conductive paste is adhered by discharging or the like, and is, for example, an insulating layer, a circuit wiring, a component terminal of an electronic component, or the like. Accordingly, the conductive paste is suitable for shaping a shaped object requiring mechanical strength (tensile strength or the like), such as a connection terminal for fixing an electronic component to an insulating layer.

In addition, the conductive ink is obtained by dispersing metal nanoparticles in a solvent, and has a lower viscosity (higher fluidity) than a conductive paste in which metal microparticles are mixed in an adhesive. Therefore, in the 3D layer shaping using the conductive ink having a relatively low viscosity, it is possible to perform fine ink jet printing as compared with the case of the 3D layer shaping using the conductive paste having a relatively high viscosity, and circuit wirings having a fine shape can be formed. On the other hand, since the conductive paste has a viscosity higher than the conductive ink, it is difficult to flow after being discharged and since the conductive paste contains micro-sized metal microparticles, a relatively thick film can be formed. In laminate unit forming device 10 of the present embodiment, an electronic circuit having improved electrical properties and mechanical properties can be produced by selectively using such conductive ink and a conductive paste to utilize the characteristics.

Figure 4:
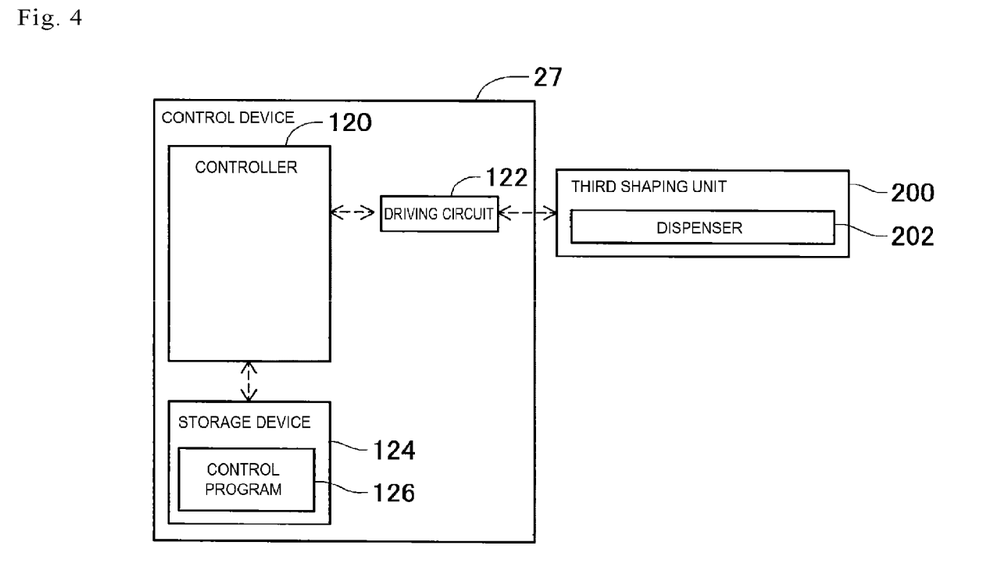
FIG. 4 is a block diagram illustrating the control device.

In addition, as illustrated in FIGS. 3 and 4, control device 27 is provided with controller 120, multiple drive circuits 122, and storage device 124. As illustrated in FIG. 3, multiple drive circuits 122 are connected to electromagnetic motors 38 and 56, holding device 62, lifting and lowering device 64, ink jet head 76, irradiation device 78, ink jet head 88, flattening device 90, irradiation device 92, tape feeder 110, mounting head 112, and moving device 114. Furthermore, as illustrated in FIG. 4, drive circuit 122 is connected to third shaping unit 200. Controller 120 is provided with CPU, ROM, RAM, and the like, is mainly a computer, and is connected to multiple drive circuits 122. Storage device 124 is provided with RAM, ROM, a hard disk, and the like, and stores control program 126 for controlling laminate unit forming device 10. Controller 120 can control the operations of conveyance device 20, first shaping unit 22, second shaping unit 24, mounting unit 26, third shaping unit 200, and the like by executing control program 126 with CPU. In the following description, the fact that controller 120 executes control program 126 to control each device may be simply referred to as a "device". For example, the fact that "controller 120 moves stage 52" means that "controller 120 executes control program 126, controls the operation of conveyance device 20 via drive circuit 122, and moves stage 52 by the operation of conveyance device 20".

(2) Production Method of 3D Laminate Electronic Device

Figure 5:
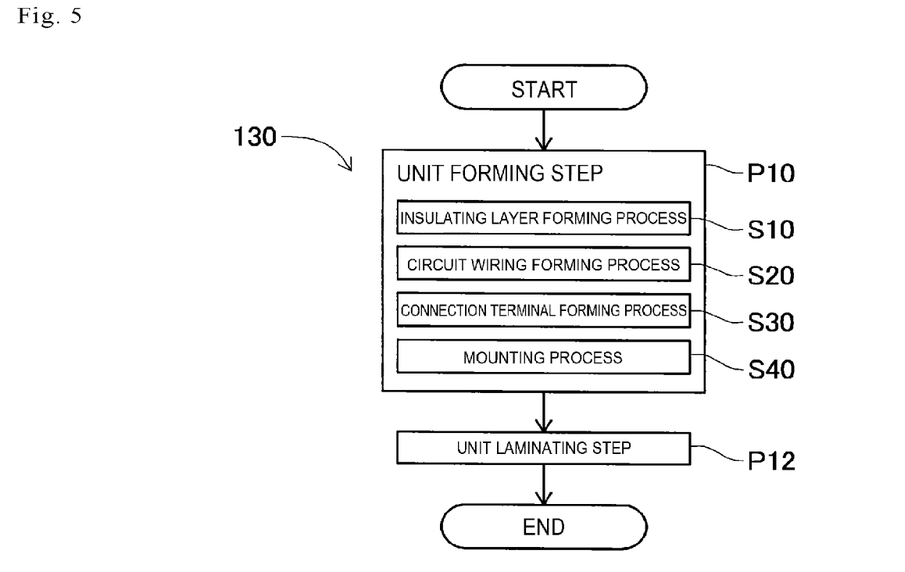
FIG. 5 is a flowchart illustrating a flow of a producing step of a 3D laminate electronic device.
Figure 6:
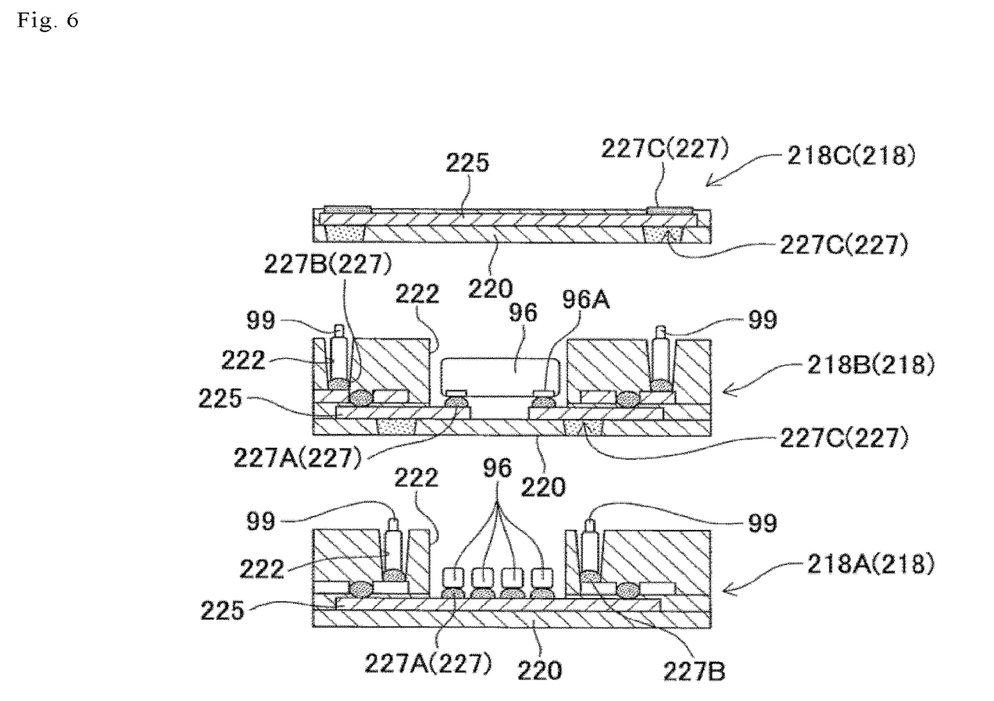
FIG. 6 is a cross-sectional view illustrating a state where the 3D laminate electronic device is produced by laminating a first laminate unit, a second laminate unit, and a third laminate unit in an up-down direction.
Figure 7:
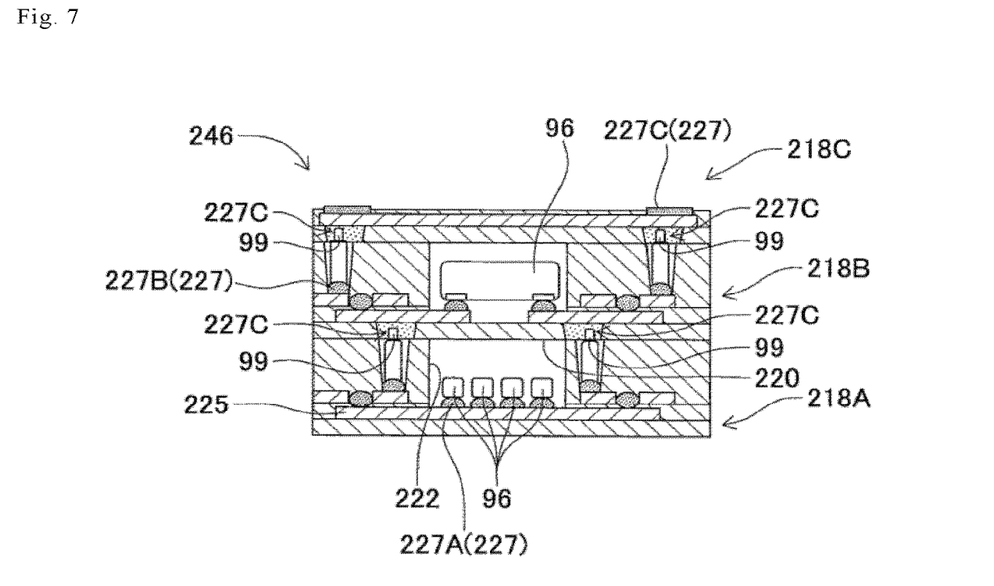
FIG. 7 is a cross-sectional view illustrating the 3D laminate electronic device.

Laminate unit forming device 10 of the present embodiment produces a 3D laminate electronic device by shaping multiple laminate units including circuit wirings, connection terminals, and electronic components according to the above configuration, and assembling the multiple laminate units. Specifically, FIG. 5 is a flowchart illustrating a flow of a producing step of the 3D laminate electronic device. FIG. 6 is a cross-sectional view illustrating a state where 3D laminate electronic device 246 is produced by laminating first laminate unit 218A, second laminate unit 218B, and third laminate unit 218C in the up-down direction. FIG. 7 is a cross-sectional view illustrating 3D laminate electronic device 246. The producing steps and 3D laminate electronic device 246 (the number and structure of the laminate units) illustrated in FIGS. 5 to 7 are examples.

As illustrated in FIG. 5, producing step 130 of 3D laminate electronic device 246 by the 3D layer shaping includes unit forming step P10 and unit laminating step P12. In unit forming step P10, first to third laminate units 218A, 218B, and 218C are formed on base material 70 by laminate unit forming device 10 described above. On the other hand, in unit laminating step P12, 3D laminate electronic device 246 (refer to FIG. 7) is produced by laminating first to third laminate units 218A, 218B, and 218C in the up-down direction. In the following descriptions, in a case where first to third laminate units 218A to 218C are collectively referred to without being distinguished from each other, these will be referred to as laminate unit 218.

Controller 120 executes unit forming step P10 by executing control program 126 and controlling each device of laminate unit forming device 10. Unit forming step P10 includes insulating layer forming process S10, circuit wiring forming process S20, connection terminal forming process S30, and mounting process S40. The execution procedure of each of the above processes S10, S20, S30, and S40 is determined by a laminating structure or the like of 3D laminate electronic device 246 (that is, first to third laminate units 218A to 218C). Therefore, each of above processes S10, S20, S30, and S40 is not repeated in their notation order.

For example, the user sets base material 70 on base plate 60 of stage 52, and instructs laminate unit forming device 10 to start producing step 130 illustrated in FIG. 5. The set of base materials 70 may be automatically executed by laminate unit forming device 10. In the case of executing the insulating layer forming process S10, controller 120 moves stage 52 on which base material 70 is set below second shaping unit 24. Controller 120 controls second shaping unit 24, discharges the ultraviolet curable resin from ink jet head 88 onto base material 70, flattens the ultraviolet curable resin by flattening device 90, and cures the ultraviolet curable resin by irradiation device 92. Controller 120 forms insulating layer 220 (refer to FIG. 6) by repeating the discharge, flattening, and curing of the ultraviolet curable resin. In addition, controller 120 forms accommodation section 222 for accommodating electronic component 96 and probe pin 99 in insulating layer forming process S10.

In addition, in the case of executing circuit wiring forming process S20, controller 120 moves stage 52 below first shaping unit 22. Controller 120 controls first shaping unit 22, discharges the conductive ink from ink jet head 76 to the upper surface or the like of insulating layer 220, and heats the discharged conductive ink by irradiation device 78 to form circuit wiring 225 (refer to FIG. 6).

In addition, in the case of executing connection terminal forming process S30, controller 120 moves stage 52 below third shaping unit 200. Controller 120 controls third shaping unit 200 to discharge the conductive paste from dispenser 202 to an upper surface of insulating layer 220, an upper surface of circuit wiring 225, a bottom portion of accommodation section 222, or the like. Controller 120 forms connection terminal 227 (refer to FIG. 6) by heating the discharged conductive paste by irradiation device 78 of first shaping unit 22. For example, as illustrated in FIG. 6, controller 120 forms component connection terminal 227A, pin terminal 227B, and electrode pad 227C as connection terminal 227. Component connection terminal 227A is, for example, connection terminal 227 connected to component terminal 96A of electronic component 96. In addition, pin terminal 227B is, for example, connection terminal 227 connected to a lower end of probe pin 99. Electrode pad 227C is, for example, connection terminal 227 for electrically connecting the electronic circuit of each laminate unit 218 to the upper end of probe pin 99, or for connecting 3D laminate electronic device 246 to an external device. Each connection terminal 227 is electrically connected by circuit wiring 225 to constitute an electronic circuit.

Controller 120 shapes each laminate unit 218 by appropriately changing the shape, position, number, and the like of each of insulating layer 220 formed in above insulating layer forming process S10, circuit wiring 225 formed in circuit wiring forming process S20, and connection terminal 227 formed in connection terminal forming process S30. In addition, controller 120 appropriately executes mounting process S40 in the process of shaping laminate unit 218. Controller 120 mounts electronic component 96 and probe pin 99 by mounting unit 26.

For example, three-dimensional data of each layer obtained by slicing 3D laminate electronic device 246 (each laminate unit 218) is set in control program 126. Based on the data of control program 126, controller 120 executes each producing step, such as circuit wiring forming process S20, to form laminate unit 218. In addition, controller 120 detects information such as a layer or a position where electronic component 96 or probe pin 99 is disposed, based on the data of control program 126, and disposes electronic component 96 or probe pin 99 in laminate unit 218 based on the detected information. For example, after controlling third shaping unit 200 to discharge the conductive paste, controller 120 controls mounting unit 26 to dispose electronic component 96 in accommodation section 222 or the like so that component terminal 96A of electronic component 96 comes into contact with the conductive paste. After disposing electronic component 96, controller 120 connects component connection terminal 227A and component terminal 96A by curing the conductive paste to fix electronic component 96 to insulating layer 220. After disposing electronic component 96, controller 120 may discharge the conductive paste onto component terminal 96A of electronic component 96 to cure the conductive paste.

In addition, for example, controller 120 controls third shaping unit 200 to discharge the conductive paste to the bottom portion of accommodation section 222 accommodating probe pin 99. Controller 120 forms pin terminal 227B at the bottom portion of accommodation section 222 by curing the conductive paste by irradiation device 78 of first shaping unit 22. Controller 120 controls mounting unit 26 to dispose probe pin 99 in accommodation section 222 so that a lower end of probe pin 99 comes into contact with cured pin terminal 227B. In this manner, laminate unit 218 having a desired structure can be formed by the 3D layer shaping.

Next, in unit laminating step P12, controller 120 assembles above-described laminate unit 218. A release film (not illustrated) to be peeled off by heat, for example, is adhered on base material 70, and each laminate unit 218 is formed on the release film. By heating the release film, each laminate unit 218 can be peeled off from base material 70. The method of separating base material 70 and laminate unit 218 is not limited to the method described above. For example, a member (support material or the like) that is melted by heat may be disposed between base material 70 and laminate unit 218, and may be melted and separated. In addition, the separation between base material 70 and laminate unit 218 may be performed automatically by laminate unit forming device 10 (for example, by robot arm) or may be performed manually by a human being.

As illustrated in FIGS. 6 and 7, by laminating multiple laminate units 218 in unit laminating step P12, 3D laminate electronic device 246 having a desired structure can be produced. The method of fixing multiple laminate units 218 to each other is not particularly limited, and a method using a screw, a bolt, a nut, or the like, or a method using an adhesive can be employed. In addition, the work for assembling multiple laminate units 218 may be automatically executed by laminate unit forming device 10. For example, laminate unit forming device 10 may be provided with a robot arm that assembles and fixes multiple laminate units 218 to each other. Alternatively, the work for assembling multiple laminate units 218 may be performed manually by the user. In addition, in the present embodiment, as probe pin 99, a probe pin that can stroke in the axial direction is used. When laminating laminate unit 218, probe pin 99 is interposed in the up-down direction by lower pin terminal 227B and upper electrode pad 227C. At this time, probe pin 99 contracts by changing the stroke amount in accordance with the distance between upper laminate unit 218 and lower laminate unit 218. As a result, it is possible to absorb an error in the thickness of laminate unit 218 caused by the 3D layer shaping or the like by the stroke amount of probe pin 99.

(3) For Selection of Conductive Ink and Conductive Paste

Figure 8:
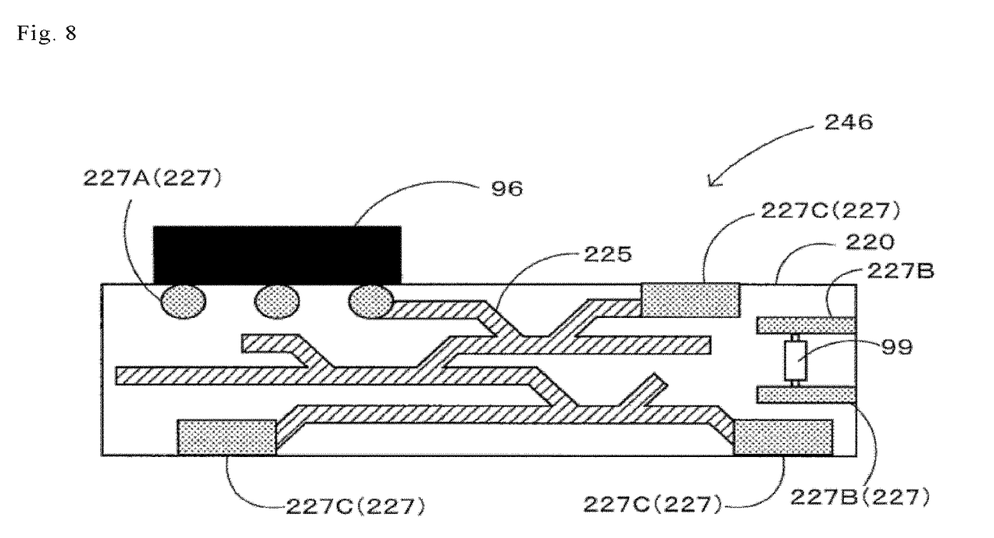
FIG. 8 is a cross-sectional view for describing a using location of the conductive ink and the conductive paste.
Figure 9:
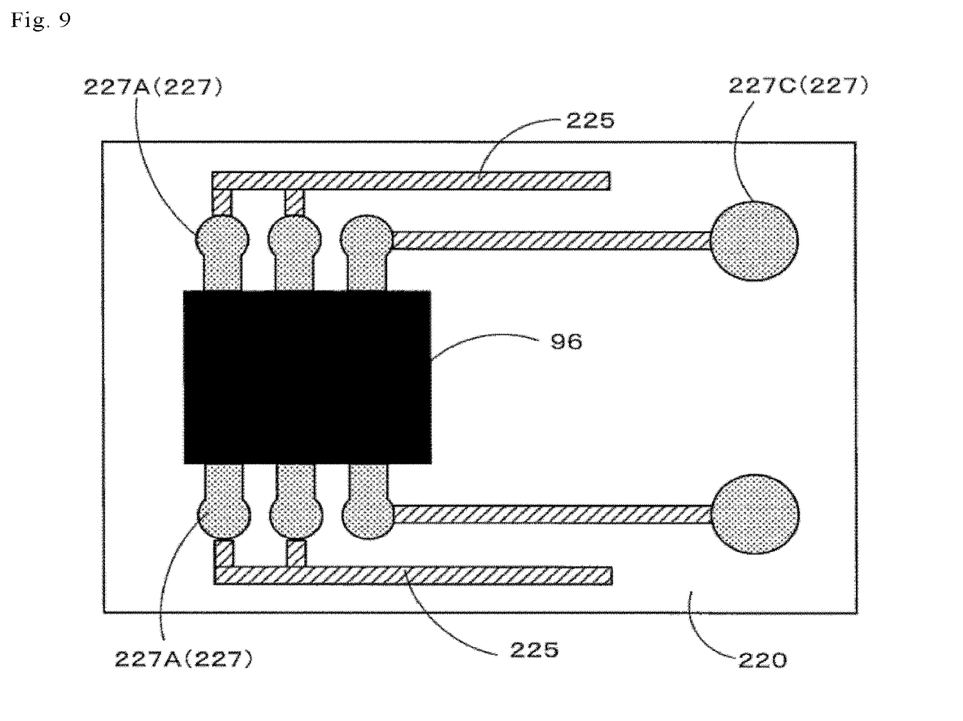
FIG. 9 is a plan view for describing a using location of the conductive ink and the conductive paste.

FIG. 8 is a cross-sectional view for describing a using location of the conductive ink and the conductive paste. FIG. 9 is a plan view for describing a using location of the conductive ink and the conductive paste. FIGS. 8 and 9 schematically illustrate a configuration of 3D laminate electronic device 246. In order to avoid complicating the drawings, electronic component 96 is mounted on the surface of insulating layer 220 in FIGS. 8 and 9, and FIGS. 11 to 13 described later. However, the production method for selectively using the conductive ink and the conductive paste described below can be similarly performed for electronic component 96 disposed in accommodation section 222 illustrated in FIG. 7.

As indicated by hatched lines in FIGS. 8 and 9, laminate unit forming device 10 of the present embodiment performs shaping using the conductive ink, for example, at a location such as circuit wiring 225 where low resistance is required. On the other hand, as illustrated by hatching with dots in FIGS. 8 and 9, since laminate unit forming device 10 is joined to, in contact with, or the like, another member such as connection terminal 227, a shaping using the conductive paste is performed at a location where mechanical strength such as tensile strength is required.

As described above, in the present embodiment, a fluid containing metal microparticles, for example, a viscous fluid in which metal microparticles are contained in an adhesive made of a resin is used as the conductive paste. In connection terminal forming process S30 (one example of the connection terminal forming step of the present disclosure) for forming connection terminal 227 illustrated in FIG. 5, controller 120 cures the adhesive contained in the conductive paste, and thus multiple metal microparticles are brought into contact with each other to cure. In addition, in circuit wiring forming process S20 (one example of the wiring forming step of the present disclosure) for forming circuit wiring 225 (one example of the wiring) illustrated in FIG. 5, controller 120 heats the fluid containing the metal nanoparticles, and thus multiple metal nanoparticles are fused to each other to cure. As a result, in connection terminal forming process S30, multiple metal microparticles are cured in a state of being in contact with each other by curing the adhesive, and connection terminal 227 having improved mechanical properties (tensile strength or the like) can be formed, for example, by adhesion of the adhesive. In addition, in circuit wiring forming process S20, by heating and fusing the multiple metal nanoparticles to each other, circuit wiring 225 having improved electrical properties (reduction of resistance value and improvement of high-frequency characteristic) can be formed.

In addition, in the present embodiment, in connection terminal forming process S30, controller 120 forms at least one connection terminal 227 of component connection terminal 227A to be connected to electronic component 96 to be mounted on insulating layer 220, electrode pad 227C to connect the electronic circuit of insulating layer 220 and the external device, and pin terminal 227B to connect probe pin 99 connecting the electronic circuits of multiple laminate units 218 to each other and the electronic circuits of laminate unit 218 as connection terminal 227. As a result, an electronic circuit having improved mechanical properties can be produced by using a fluid containing metal microparticles in a portion of the electronic circuit to be mounted on 3D laminate electronic device 246 requiring mechanical strength.

In addition, as described above, the conductive ink of the present embodiment is excellent in electrical properties, and the conductive paste is excellent in mechanical properties. Therefore, in a case where circuit wiring 225 formed of the conductive ink and connection terminal 227 formed of the conductive paste are overlapped with each other, the resistance value or the like can be reduced by increasing the ratio of the conductive ink. Conversely, when the ratio of the conductive paste is increased, it is possible to improve the tensile strength or the like.

Figure 10:
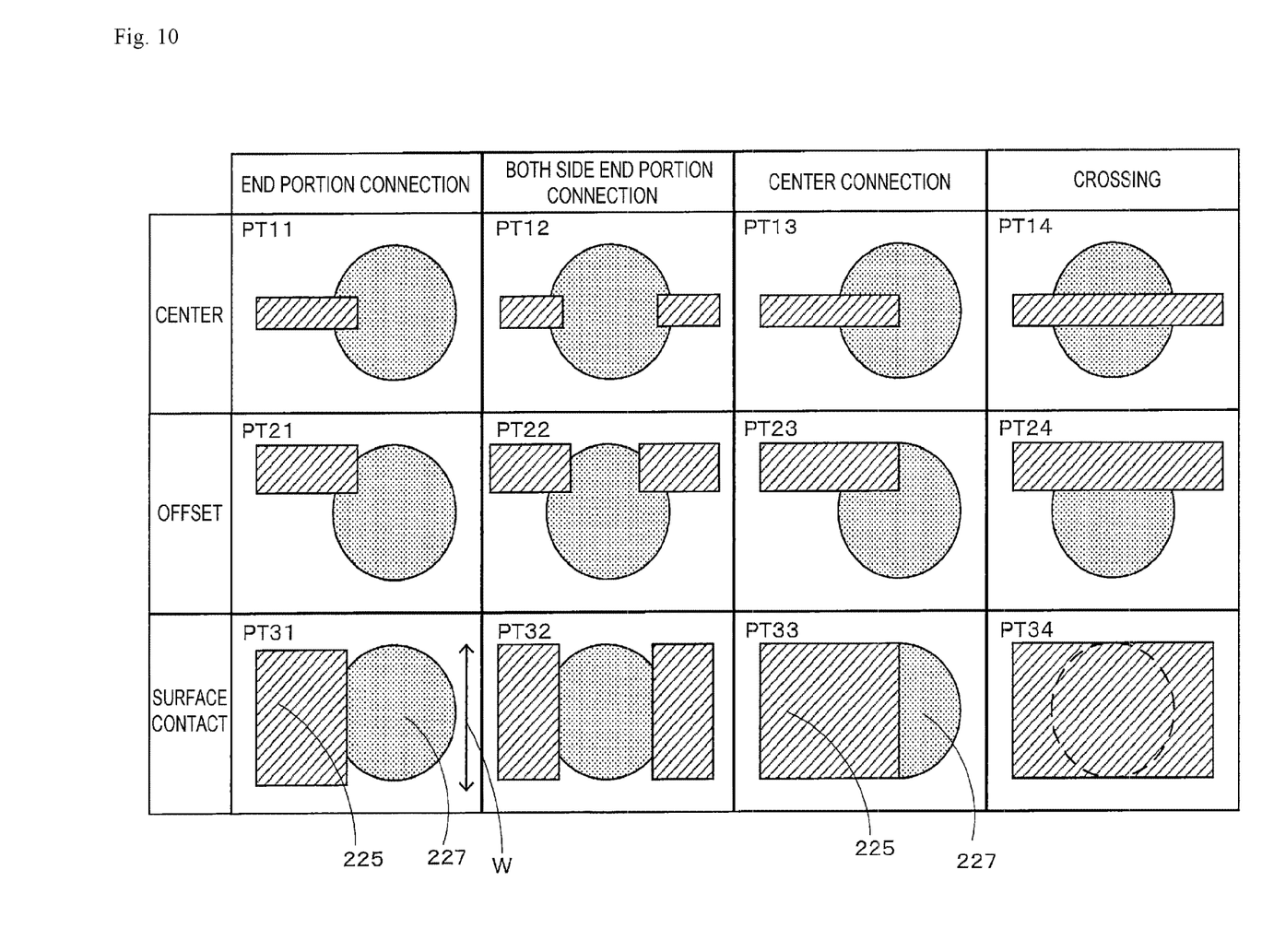
FIG. 10 is a table illustrating connection patterns of circuit wirings and connection terminals.
Figure 11:
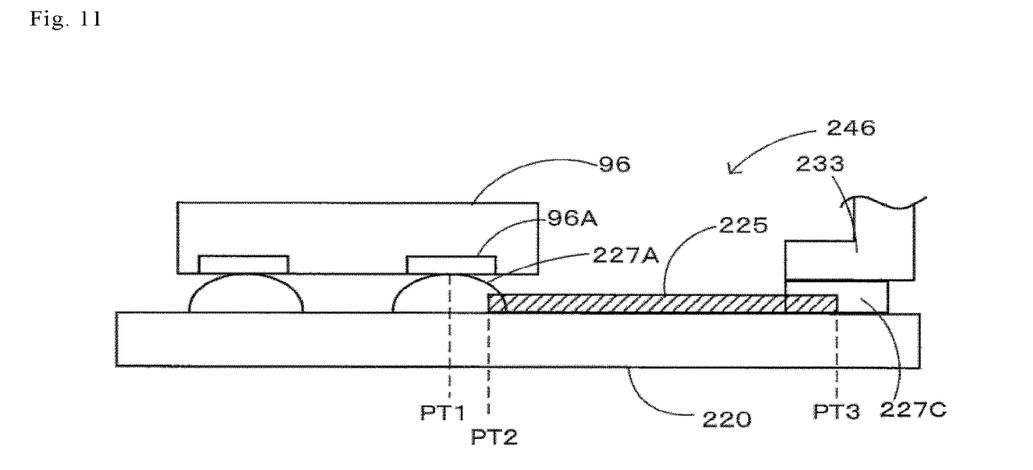
FIG. 11 is a diagram schematically illustrating a portion where the connection terminals are overlapped with the circuit wiring.

FIG. 10 is a table illustrating connection patterns of circuit wirings 225 and connection terminals 227. FIG. 11 is a diagram schematically illustrating a portion where connection terminals 227 are overlapped with circuit wiring 225. FIG. 10 illustrates an example of twelve connection patterns PT11 to PT34 from PT11 to PT34. FIG. 10 illustrates a schematic view of the overlapping portion of circuit wiring 225 and connection terminal 227 in a plan view with connection patterns PT11 to PT34.

The overlapping portion referred to here is, for example, a portion in which component connection terminal 227A connected to component terminal 96A of electronic component 96 illustrated in FIG. 11 covers an end portion of circuit wiring 225. Component connection terminal 227A electrically connects component terminal 96A to circuit wiring 225, and fixes component terminal 96A to insulating layer 220. In this case, component connection terminal 227A is required to have tensile strength so that electronic component 96 does not fall off 3D laminate electronic device 246.

Therefore, as illustrated in FIG. 11, in circuit wiring forming process S20, for example, controller 120 is formed so as to draw out circuit wiring 225 from position PT2 which is a position covered with component connection terminal 227A and is away from position PT1 directly below component terminal 96A as a starting point. As a result, by separating position PT2 at which circuit wiring 225 is drawn out from component terminal 96A, the ratio of circuit wiring 225 in the portion covered with component connection terminal 227A is reduced, in other words, the ratio of the conductive paste in the location where component terminal 96A is fixed to insulating layer 220 is increased, and thus the mechanical strength can be improved. As a result, electronic component 96 can be more firmly fixed to insulating layer 220 via component connection terminal 227A, and electronic component 96 can be prevented from falling off or peeling off even when a large electronic component 96 is used.

For example, in the leftmost column (connection patterns PT11, PT21, and PT31) illustrated in FIG. 10, circuit wiring 225 is drawn out from the outside (end portion side) of connection terminal 227 as a starting point. In this case, the ratio of the portion of circuit wiring 225 covered with connection terminal 227 to entire connection terminal 227 is small. Mechanical properties of electronic component 96 or the like to be joined by connection terminal 227 can be improved.

In addition, electrode pad 227C illustrated in FIG. 11 is connected to external device terminal 233 that is a terminal of an external device. The external device is, for example, a device that is not normally fixed to 3D laminate electronic device 246 but is connected when necessary. In this case, external device terminal 233 need not be fixed to insulating layer 220 by electrode pad 227C. In a case where such electrode pad 227C is formed, for example, controller 120 forms circuit wiring 225 so as to be drawn out from position PT3 which is a position covered with electrode pad 227C and is directly below external device terminal 233 in circuit wiring forming process S20. For example, position PT3 is a center position (a position that is a center in a plan view) of a portion of entire external device terminal 233 in contact with electrode pad 227C in a case where external device terminal 233 and electrode pad 227C are electrically connected so that 3D laminate electronic device 246 and the external device can normally communicate. As a result, by drawing out circuit wiring 225 from position PT3 directly below external device terminal 233 as a starting point, the draw-out position of external device terminal 233 and circuit wiring 225 can be brought closer to each other. The amount (ratio) of electrode pad 227C (conductive paste) interposed between external device terminal 233 and circuit wiring 225 can be reduced, and the resistance value in the electrical connection between the external device and circuit wiring 225 (3D laminate electronic device 246) can be further reduced. As a result, in a case where an external device requiring a low-resistance connection or the like is connected to electrode pad 227C, the external device can be normally operated.

For example, in the second column from the right illustrated in FIG. 10 (connection patterns PT13, PT23, and PT33), in the case of being viewed in the extending direction of circuit wiring 225 (left-right direction in FIG. 10), circuit wiring 225 is drawn out from the midpoint of connection terminal 227 (center position in connection pattern PT13). In this case, the distance between the draw-out position (starting point) of circuit wiring 225 and the terminal (such as external device terminal 233) connected to connection terminal 227 can be made as close as possible, and the resistance value in the electronic circuit connecting circuit wiring 225 and external device terminal 233 can be reduced.

Accordingly, in connection terminal forming process S30, controller 120 of the present embodiment forms component connection terminal 227A (example of the first connection terminal) to be connected to electronic component 96 to be mounted on insulating layer 220 (example of the insulating member), and electrode pad 227C (example of the second connection terminal) for connecting the electronic circuit of insulating layer 220 and the external device. Each of component connection terminal 227A and electrode pad 227C is formed so as to cover a part of circuit wiring 225 from above. The ratio of the portion of circuit wiring 225 covered with component connection terminal 227A to entire component connection terminal 227A is smaller than the ratio of the portion of circuit wiring 225 covered with electrode pad 227C to entire electrode pad 227C (refer to FIG. 11). As a result, for electrode pad 227C connected to the external device, by relatively increasing the ratio of circuit wiring 225 to entire electrode pad 227C, it is possible to reduce the electrical resistance (improvement of the electrical properties). In addition, for component connection terminal 227A such as the bump for connecting electronic component 96, by relatively reducing the ratio of circuit wiring 225 to entire component connection terminal 227A, it is possible to improve the mechanical strength (improvement of mechanical properties).

Similarly, for example, in a portion where probe pin 99 is not physically fixed, such as pin terminal 227B illustrated in FIG. 6, but is in contact with and electrically connected to probe pin 99, circuit wiring 225 may be drawn out from a position directly below probe pin 99, as in electrode pad 227C illustrated in FIG. 11 described above, and the connection resistance between circuit wiring 225 and probe pin 99 may be reduced. Alternatively, as in component connection terminal 227A illustrated in FIG. 11 described above, pin terminal 227B may be firmly fixed by insulating layer 220 by drawing out circuit wiring 225 from a position away directly below probe pin 99 as a starting point. As described above, when laminate unit 218 is laminated, pin terminal 227B interposes probe pin 99 from the above and below, and stress corresponding to the stroke amount is applied. Therefore, in a case where mechanical strength is required for pin terminal 227B, the ratio of the conductive paste is increased to improve the mechanical properties.

Figure 12:
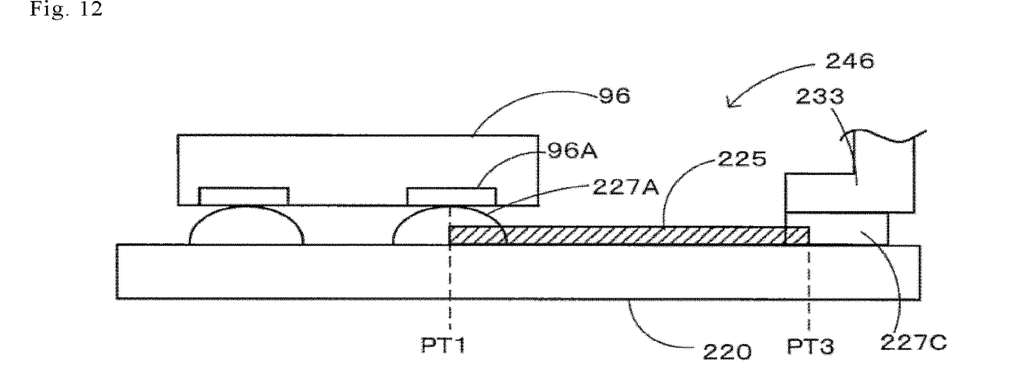
FIG. 12 is a diagram schematically illustrating a portion where connection terminals are overlapped with a circuit wiring of another example.

As illustrated in FIG. 12, circuit wiring 225 may be drawn out from position PT1 directly below component terminal 96A, and the distance between component terminal 96A and circuit wiring 225 may be shortened to reduce the connection resistance. For example, for electronic component 96 that is compact and requires a low connection resistance, circuit wiring 225 can be drawn out from position PT1 to reduce the connection resistance. In addition, as illustrated in FIG. 11, position PT3 at which circuit wiring 225 is drawn out from electrode pad 227C may be set at a position closer to the outside (end portion side) of electrode pad 227C. For example, for electrode pad 227C or the like for which the contact (connection) with external device terminal 233 is frequently repeated, draw-out position PT3 of circuit wiring 225 is placed outside, the tensile strength of electrode pad 227C is increased, and thus electrode pad 227C can be prevented from peeling off.

The method of selectively using the conductive ink and the conductive paste described above is not particularly limited. For example, the material to be used, the position at which connection terminal 227 is formed, the position at which circuit wiring 225 is drawn out, and the like may be set in the three-dimensional data of control program 126, and thus these may be selectively used. As a result, controller 120 can produce 3D laminate electronic device 246 having improved electrical properties and mechanical properties by executing the 3D layer shaping based on control program 126 and performing the shaping according to the above-described selection. Alternatively, controller 120 may automatically change a material to be used, a draw-out position of circuit wiring 225, or the like based on a value of a connection resistance required for electronic component 96, a position at which connection terminal 227 is shaped, a target object to connect connection terminal 227, or the like.

In addition, controller 120 can selectively use connection patterns PT11 to PT34 illustrated in FIG. 10, for example, based on control program 126. For example, in a case where it is desired to draw out two circuit wirings 225 from connection terminal 227 while improving the mechanical properties, controller 120 uses connection patterns PT12, PT22, and PT32. In addition, for example, in a case where it is desired to draw out two circuit wirings 225 from connection terminal 227 while improving the electrical properties, controller 120 uses connection patterns PT14, PT24, and PT34.

In addition, in a case where it is desired to retract circuit wiring 225, controller 120 forms circuit wiring 225 from the offset position illustrated in the second row in FIG. 10. The case where it is desired to retract referred to herein means, for example, a case where component terminal 96A is relatively larger than component connection terminal 227A and circuit wiring 225 and component terminal 96A interfere with each other. In addition, in a case where it is not necessary to retract circuit wiring 225, controller 120 can bring the distance between component terminal 96A or the like and circuit wiring 225 closer to each other by drawing out circuit wiring 225 from the center position illustrated in the first row in FIG. 10.

In addition, in a case where it is desired to further reduce the electrical resistance, controller 120 forms circuit wiring 225 by the surface contact illustrated in the third row in FIG. 10. When circuit wiring 225 is formed by the surface contact, for example, controller 120 makes wiring width W of circuit wiring 225 the same as or larger than the width of connection terminal 227. As a result, the contact area between circuit wiring 225 and connection terminal 227 can be increased, and the connection resistance can be further reduced. In addition, in a case where a low resistance is not required to use the surface contact, controller 120 draws out circuit wiring 225 from the central position illustrated in the first row of FIG. 10 and narrows wiring width W, so that circuit wiring 225 can be downsized and the amount of conductive ink used can be reduced.

Figure 13:
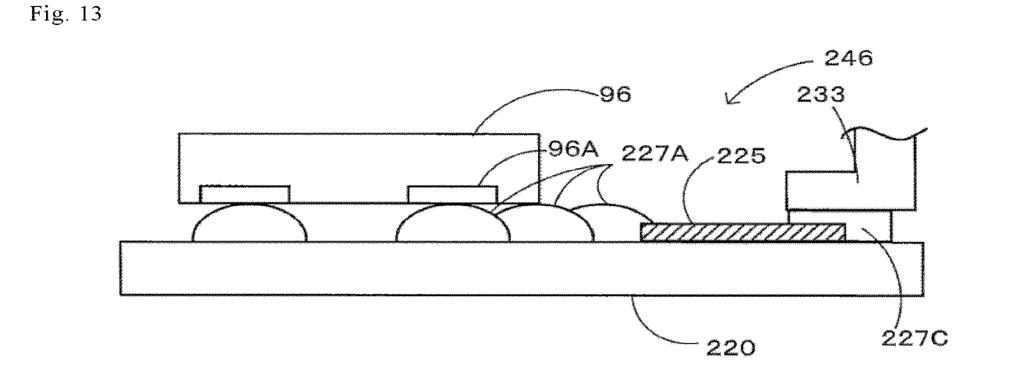
FIG. 13 is a diagram schematically illustrating a portion where connection terminals are overlapped with a circuit wiring of another example.

In addition, as illustrated in FIG. 13, controller 120 may increase the number of component connection terminals 227A and the draw-out position of circuit wiring 225 may be further separated from component terminal 96A. As a result, circuit wiring 225 can be eliminated from directly below electronic component 96, the force for fixing electronic component 96 by component connection terminal 227A can be enhanced, and electronic component 96 can be firmly fixed to insulating layer 220. In addition, instead of forming multiple component connection terminals 227A, for example, as illustrated in FIG. 9, electronic component 96 and circuit wiring 225 may be separated from each other by increasing or lengthening component connection terminal 227A along the plane direction of insulating layer 220.

In addition, as illustrated in FIGS. 11 to 13, controller 120 of the present embodiment forms connection terminal 227 so as to cover circuit wiring 225 from above. As illustrated in FIG. 2, the conductive ink of the present embodiment has a low viscosity and high fluidity. Therefore, even when the conductive ink is discharged on the surface of connection terminal 227 after the conductive paste is discharged to form connection terminal 227, the conductive ink may flow down from the surface of connection terminal 227. On the other hand, the conductive paste has a high viscosity and is likely to adhere to a target object. Therefore, in the case of connecting circuit wiring 225 and connection terminal 227, controller 120 forms circuit wiring 225 in advance, and forms connection terminal 227 on formed circuit wiring 225.

Accordingly, in the case of connecting circuit wiring 225 and connection terminal 227, controller 120 of the present embodiment executes circuit wiring forming process S20 to form circuit wiring 225, then applies a fluid containing metal microparticles to formed circuit wiring 225, and cures the fluid containing the applied metal microparticles to form connection terminal 227. As described above, in the 3D layer shaping method, even when a fluid containing metal nanoparticles, that is, a fluid having a high fluidity is applied on a member having unevenness such as connection terminal 227, it is difficult to cause the fluid to uniformly remain on the target object, and it is difficult to form circuit wiring 225 having a uniform thickness. Therefore, by first forming circuit wiring 225 with the metal nanoparticles, circuit wiring 225 having a uniform thickness can be formed. By applying a fluid containing metal microparticles having a relatively high viscosity on previously formed circuit wiring 225, connection terminal 227 can be suitably formed on circuit wiring 225. In a case where the conductive ink can be adhered to connection terminal 227 or the like, after connection terminal 227 is formed, the conductive ink may be discharged on connection terminal 227 to form circuit wiring 225 on the surface of connection terminal 227. Alternatively, for example, in a case where a conductive paste is discharged into a hole formed in insulating layer 220 to form a through-hole, after the conductive paste is first discharged to form the through-hole, controller 120 may discharge conductive ink onto the through-hole to form circuit wiring 225.

(4) Summary

As described in detail above, the electronic circuit production method using 3D layer shaping of the present embodiment includes circuit wiring forming process S20 in which the conductive ink containing a nano-sized metal nanoparticle is applied on insulating layer 220, and the applied conductive ink is cured to form circuit wiring 225. In addition, the electronic circuit production method using 3D layer shaping includes connection terminal forming process S30 in which the conductive paste containing a micro-sized metal microparticle is applied, and the applied conductive paste is cured to form connection terminal 227 electrically connected to circuit wiring 225.

As a result, the type of fluid containing metal particles is selectively used for the shaping of connection terminal 227 and the shaping of circuit wiring 225. In a case where circuit wiring 225 is formed, circuit wiring 225 is formed by applying and curing the conductive ink. As a result, circuit wiring 225 having low resistance can be formed by curing the nano-sized metal nanoparticles by contacting or fusing with each other. In addition, in a case where connection terminal 227 is formed, connection terminal 227 is formed by applying and curing the conductive paste. As a result, a layer having a certain thickness can be formed with the micro-sized metal microparticles, and mechanical properties such as the tensile strength of connection terminal 227 after shaping can be improved. Accordingly, it is possible to produce an electronic circuit having improved electrical properties and mechanical properties by utilizing the characteristics of the fluid containing the metal particles by selectively using the fluid containing the metal particles.

Incidentally, in the present embodiment, insulating layer 220 is an example of a resin member. Circuit wiring 225 is an example of a wiring. Component connection terminal 227A is an example of the first connection terminal. Electrode pad 227C is an example of the second connection terminal. Circuit wiring forming process S20 is an example of a wiring forming step. Connection terminal forming process S30 is an example of a connection terminal forming step.

(5) Modification Example

The present disclosure is not limited to the above-described embodiment, and various modifications can be made within the scope not departing from the concept of the present disclosure. For example, although component connection terminal 227A, pin terminal 227B, and electrode pad 227C are formed using a conductive paste, laminate unit forming device 10 may have a configuration for forming at least one of three connection terminals 227. In addition, the type of metal nanoparticles and the solvent used in the conductive ink of the present application is not particularly limited. In addition, the type of metal microparticles or the adhesive used in the conductive paste of the present application is not particularly limited. In addition, the resin constituting insulating layer 220 is not limited to an ultraviolet curable resin, and may be, for example, a thermoplastic resin or a thermosetting resin. In addition, in the above embodiment, laminate unit forming device 10 formed insulating layer 220 in which the ultraviolet curable resin was cured as the resin material of the present disclosure by 3D layer shaping. However, laminate unit forming device 10 may form circuit wiring 225 and connection terminal 227 on a resin material formed by a method other than the 3D layer shaping (injection molding or the like). The configuration of laminate unit forming device 10 described above is an example, and can be appropriately changed. For example, laminate unit forming device 10 may not be provided with mounting unit 26 for mounting electronic components. In addition, as the 3D layer shaping method of the present disclosure, for example, a stereo lithography method, a fused deposition molding method, or the like can be employed in addition to an ink jet method.

REFERENCE SIGNS LIST 10 laminate unit forming device, S20 circuit wiring forming process (wiring forming step), S30 connection terminal forming process (connection terminal forming step), 96 electronic component, 99 probe pin, 218 laminate unit (insulating member), 220 insulating layer (insulating member), 225 circuit wiring (wiring), 227 connection terminal, 227A component connection terminal (first connection terminal), 227B pin terminal, 227C electrode pad (second connection terminal), 246 3D laminate electronic device

The invention claimed is:

1. An electronic circuit production method using 3D layer shaping, the method comprising:
    an insulating layer forming step of forming an insulating layer by repeatedly discharging an ultraviolet curable resin, flattening the ultraviolet curable resin, and curing the ultraviolet curable resin, the insulating layer including an accommodation section in which an electronic component may be disposed, the accommodation section being a recess defined by a bottom surface and side walls;
    a wiring forming step of forming a wiring by applying a first fluid containing a nano-sized metal nanoparticle on the insulating layer and curing the applied first fluid containing the metal nanoparticle; and
    a connection terminal forming step of forming a connection terminal electrically connected to the wiring by applying a second fluid containing a micro-sized metal microparticle and curing the applied second fluid containing the metal microparticle, wherein
    the first fluid and the second fluid are different from each other, a viscosity of the first fluid being lower than a viscosity of the second fluid,
    the first fluid is applied using an ink jet head, and the second fluid is applied using a dispenser or a printing device,
    the second fluid containing the metal microparticle is a viscous fluid in which the metal microparticle is contained in an adhesive made of a resin,
    in the connection terminal forming step, multiple metal microparticles are brought into contact with each other to be cured by curing the adhesive,
    in the wiring forming step, multiple metal nanoparticles are fused to each other to cure by heating the first fluid containing the metal nanoparticle, and
    in the connection terminal forming step, the connection terminal includes a first connection terminal provided on the bottom surface of the accommodation section to be connected to the electronic component disposed in the accommodation section, a second connection terminal that connects an electronic circuit of the insulating layer and an external device, and a third connection terminal that connects a probe pin connecting electronic circuits of multiple insulating layers to each other to the electronic circuit of the insulating layer.

2. The electronic circuit production method using 3D layer shaping according to claim 1, wherein
    after the wiring forming step is executed to form the wiring, the second fluid containing the metal microparticle is applied to the formed wiring, and the applied second fluid containing the metal microparticle is cured to form the connection terminal.

3. The electronic circuit production method using 3D layer shaping according to claim 1, wherein
    in the wiring forming step, the wiring drawn out from a position covered with the first connection terminal and is away from directly below the first component terminal as a starting point is formed.

4. The electronic circuit production method using 3D layer shaping according to claim 1, wherein
in the wiring forming step, the wiring drawn out from a position covered with the first connection terminal and directly below the first component terminal is formed.

5. The electronic circuit production method using 3D layer shaping according to claim 1, wherein
each of the first connection terminal and the second connection terminal is formed so as to cover a part of the wiring from above, and
a ratio of a portion of the wiring covered with the first connection terminal to the entire first connection terminal is smaller than a ratio of a portion of the wiring covered with the second connection terminal to the entire second connection terminal.

* * * * *